United States Patent
Scott et al.

(10) Patent No.: US 7,234,125 B1
(45) Date of Patent: Jun. 19, 2007

(54) TIMING ANALYSIS FOR PROGRAMMABLE LOGIC

(75) Inventors: Alasdair Scott, High Wycombe (GB); Gregor Nixon, Bicester (GB)

(73) Assignee: Altera Corporation, San Jose, CA (US)

( * ) Notice: Subject to any disclaimer, the term of this patent is extended or adjusted under 35 U.S.C. 154(b) by 254 days.

(21) Appl. No.: 10/874,996

(22) Filed: Jun. 23, 2004

Related U.S. Application Data

(60) Provisional application No. 60/483,525, filed on Jun. 26, 2003, provisional application No. 60/480,917, filed on Jun. 23, 2003.

(51) Int. Cl.
*G06F 17/50* (2006.01)

(52) U.S. Cl. .............................. 716/17; 716/6; 716/11

(58) Field of Classification Search ................... 716/4, 716/6, 8, 12, 13, 17; 703/14
See application file for complete search history.

(56) References Cited

U.S. PATENT DOCUMENTS

| | | | | |
|---|---|---|---|---|
| 5,068,603 | A | | 11/1991 | Mahoney ................ 324/158 R |
| 5,212,652 | A | | 5/1993 | Agrawal et al. ............ 364/489 |
| 5,521,837 | A | * | 5/1996 | Frankle et al. ............... 716/10 |
| 5,550,839 | A | | 8/1996 | Buch et al. |
| 5,815,405 | A | | 9/1998 | Baxter ........................ 364/489 |
| 5,825,202 | A | | 10/1998 | Tavana et al. ................ 326/39 |
| 5,874,834 | A | | 2/1999 | New ............................ 326/39 |
| 5,946,478 | A | * | 8/1999 | Lawman ...................... 716/17 |
| 6,091,262 | A | | 7/2000 | New ............................ 326/39 |
| 6,094,065 | A | | 7/2000 | Tavana et al. ................ 326/39 |
| 6,177,844 | B1 | | 1/2001 | Sung et al. ................... 331/25 |
| 6,242,945 | B1 | | 6/2001 | New ............................ 326/39 |
| 6,311,316 | B1 | | 10/2001 | Huggins et al. ............. 716/12 |
| 6,385,760 | B2 | * | 5/2002 | Pileggi et al. ................. 716/8 |
| 6,486,702 | B1 | | 11/2002 | Ngai et al. .................... 326/40 |
| 6,490,707 | B1 | | 12/2002 | Baxter ......................... 716/2 |
| 6,492,833 | B1 | | 12/2002 | Asson et al. ................. 326/41 |
| 6,515,509 | B1 | | 2/2003 | Baxter ......................... 326/39 |
| 6,526,563 | B1 | | 2/2003 | Baxter ......................... 716/18 |
| 6,625,788 | B1 | * | 9/2003 | Vashi et al. ................... 716/6 |
| 6,643,832 | B1 | * | 11/2003 | Ray et al. ..................... 716/6 |
| 6,938,236 | B1 | * | 8/2005 | Park et al. ..................... 716/17 |
| 2004/0002844 | A1 | * | 1/2004 | Jess et al. ..................... 703/14 |
| 2004/0088663 | A1 | * | 5/2004 | Wu et al. ....................... 716/6 |
| 2004/0205683 | A1 | * | 10/2004 | Kovacs-Birkas et al. ...... 716/6 |
| 2004/0216072 | A1 | * | 10/2004 | Alpert et al. .................. 716/13 |

(Continued)

OTHER PUBLICATIONS

Xilinx, *HardWire Data Book*, "XC3300 Family HardWire Logic Cell Arrays," Preliminary Product Specification, 1991.

(Continued)

*Primary Examiner*—Leigh M. Garbowski
(74) *Attorney, Agent, or Firm*—Fish & Neave IP Group of Ropes & Gray LLP; Jeffrey H. Ingerman

(57) ABSTRACT

Programming software for mask-programmable logic devices provides a timing estimation to the user for the user's logic design during the compilation stage, notwithstanding that the software is not aware of the ultimate placement and routing of the design, which will be performed by the mask-programmable logic device supplier. The software includes a timing model based on actual delay measurements for different user designs in similar devices.

32 Claims, 10 Drawing Sheets

U.S. PATENT DOCUMENTS

2004/0243964 A1* 12/2004 McElvain et al. ............ 716/12

OTHER PUBLICATIONS

Xilinx, *HardWire Data Book*, pp. 1-1 through 2-28, 1994.

Mehendale, M., "A System for Behavior Extraction from FPGA Implementations of Synchronous Designs," *IEEE Proceedings, The Fifth International Conference on VLSI Design*, Jan. 4-7, 1992, pp. 320-321.

* cited by examiner

TIMING ANALYSIS FOR PROGRAMMABLE LOGIC

CROSS REFERENCE TO RELATED APPLICATIONS

This claims the benefit of commonly-assigned U.S. Provisional Patent Applications Nos. 60/480,917 and 60/483,525, filed Jun. 23, 2003 and Jun. 26, 2003, respectively, each of which is hereby incorporated herein by reference in its respective entirety.

BACKGROUND OF THE INVENTION

This invention relates to providing a user of programmable logic with a timing analysis of the user's logic design as early as possible in the user's preparation of the logic design. The invention is applicable to all types of programmable logic device, but is particularly useful in the context of mask-programmable logic devices.

Programmable logic devices, sometimes known as "field-programmable gate arrays" ("FPGAs") are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (i.e., "product term" or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic). More recently, such devices have been provided with specialized functional blocks, such as multipliers and multiplier/accumulator blocks for digital signal processing.

In all of the foregoing programmable logic devices, both the logic functions of particular logic elements in the device, and the interconnect for routing of signals between the logic elements, were programmable. Such devices will be referred to hereinbelow as "conventional programmable logic devices" or "user-programmable logic devices" or "field-programmable logic devices," with the latter not to be confused with the term "field-programmable gate array" which is considered to be a subset of the type of device described by the three foregoing terms.

More recently, mask-programmable logic devices have been provided. With mask-programmable logic devices, instead of selling all users the same device, the manufacturer manufactures a partial device with a standardized arrangement of logic elements whose functions are not programmable by the user, and which lacks any routing or interconnect resources.

To program a mask-programmable logic device, the user provides the manufacturer of the mask-programmable logic device with the specifications of a desired device, which may be the configuration file for programming a comparable conventional programmable logic device. The manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

While conventional programmable logic devices allow a user to easily design a device to perform a desired function, a conventional programmable logic device invariably includes resources that may not be used for a particular design. Moreover, in order to accommodate general purpose routing and interconnect resources, and the switching resources that allow signals from any logic element to reach any desired routing and interconnect resource, conventional programmable logic devices grow ever larger as more functionality is built into them, increasing the size and power consumption of such devices. The routing of signals through the various switching elements as they travel from one routing and interconnect resource to another also slows down signals.

The advent of mask-programmable logic devices has allowed users to prove a design in a conventional programmable logic device, but to commit the production version to a mask-programmable logic device which, for the same functionality, can be significantly smaller and use significantly less power, because the only interconnect and routing resources present on the device are those actually needed for the particular design. In addition, those resources are simple metallizations, so there are no general purpose switching elements consuming space or power, or slowing down signals.

Nevertheless, heretofore the programming of mask-programmable logic devices has been accomplished by the provision to the manufacturer of the user's programming file for the user's logic design as implemented a comparable conventional programmable logic device. The manufacturer would then make its best effort to translate that design into the most efficient possible mask-programmed logic device. However, the manufacturer could not in all cases implement the design as the user would have done.

For example, a user may have wanted the device to operate at a certain frequency of operation. Or the user design may include certain numbers of certain types of components which are available in different numbers in the different devices, so that the user would design the programming differently to account for such differences. The manufacturer could not necessarily deduce such desires from the configuration file. However, heretofore the user would not have had the tools necessary to determine the timing delays that affect frequency of operation, because timing analysis heretofore has been carried out after the place-and-route step, which is performed by the manufacturer. This differs from user-programmable logic devices, where the programming software is "aware" of the final design and can provide timing information to the user.

It would be desirable to be able to provide timing information to a user of mask-programmable logic devices during the user design phase.

SUMMARY OF THE INVENTION

The present invention provides timing information to a user of mask-programmable logic devices during the user design phase by estimating the timing delays based on statistical modeling of actual measured delays in previously programmed devices of similar character. Preferably, those devices of similar character are devices manufactured using similar semiconductor processes—e.g., a 130 nm process or a 90 nm process, or whatever the then-current standard process may be. More preferably, the devices of similar character are devices of the same model.

The delays preferably are modeled based on similar connections. For example, preferably the delays are based on Manhattan distance—i.e., the distance from a source to a destination following the routing grid as a opposed to a straight line (similar to walking on the streets of the New York City borough of Manhattan), bounding box dimension (e.g., semi-perimeter—i.e., Manhattan distance from one corner of the bounding box to the diagonally opposite corner), and fanout number. In one preferred embodiment, the delays are binned by fanout number, and for each fanout number, a coordinate system is modeled in which one of three orthogonal axes represents delay, one represents Manhattan distance, and one represents bounding box dimension.

Actual delays preferably are plotted in that coordinate space, for a particular fanout number. A function preferably is then fit to the delays. The function, which may be a least-squares fit or any other suitable fit, is represented by a surface, which may be planar. The surface intersects the plane formed by the delay axis and the Manhattan distance axis and the plane formed by the delay axis and the bounding box dimension axis. Each of those intersections is a curve, which may be a line or other curve, that can be used to estimate the separate effect of Manhattan distance or bounding box dimension on the delay, for that particular fanout number.

It may be that the delay as a function of Manhattan distance (or bounding box dimension) is so different in various ranges of Manhattan distance (or bounding box dimension) that no one function provides an adequate fit. In such a case, the delay may be represented by different functions for different ranges of Manhattan distance (or bounding box dimension)—e.g., one function for lower Manhattan distances (or bounding box dimensions) and one function for higher Manhattan distances (or bounding box dimensions). These would then result in more complex surfaces representing the estimated delay as a function of Manhattan distance and bounding box dimensions, for that particular fanout number, for devices of the type being modeled.

The functions computed in accordance with the present invention to model delay may intentionally be made pessimistic. That is, they may be designed to overestimate the delay—e.g., by making the modeled delay longer than the actual measured delay in, e.g., 90%, or some other high percentage, of cases. In one embodiment, the model would include a model based on best fit, as described above, for more sophisticated users, with an offset to reflect the overstatement of delay for less sophisticated users. Thus, preferably the overstated delay would be the default, with the user having the option of selecting the delay modeled on best fit without the overstatement.

Thus, in accordance with the present invention, there is provided a method of programming a mask-programmable logic device to create a mask-programmed logic device that performs one or more desired functions. The method includes designing programming to perform those one or more desired functions, thereby creating one or more programmable logic device configuration files. That designing of the programming includes estimating routing delays for the mask-programmed logic device.

A mask-programmed logic device so programmed is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1–12.

Figure 1:
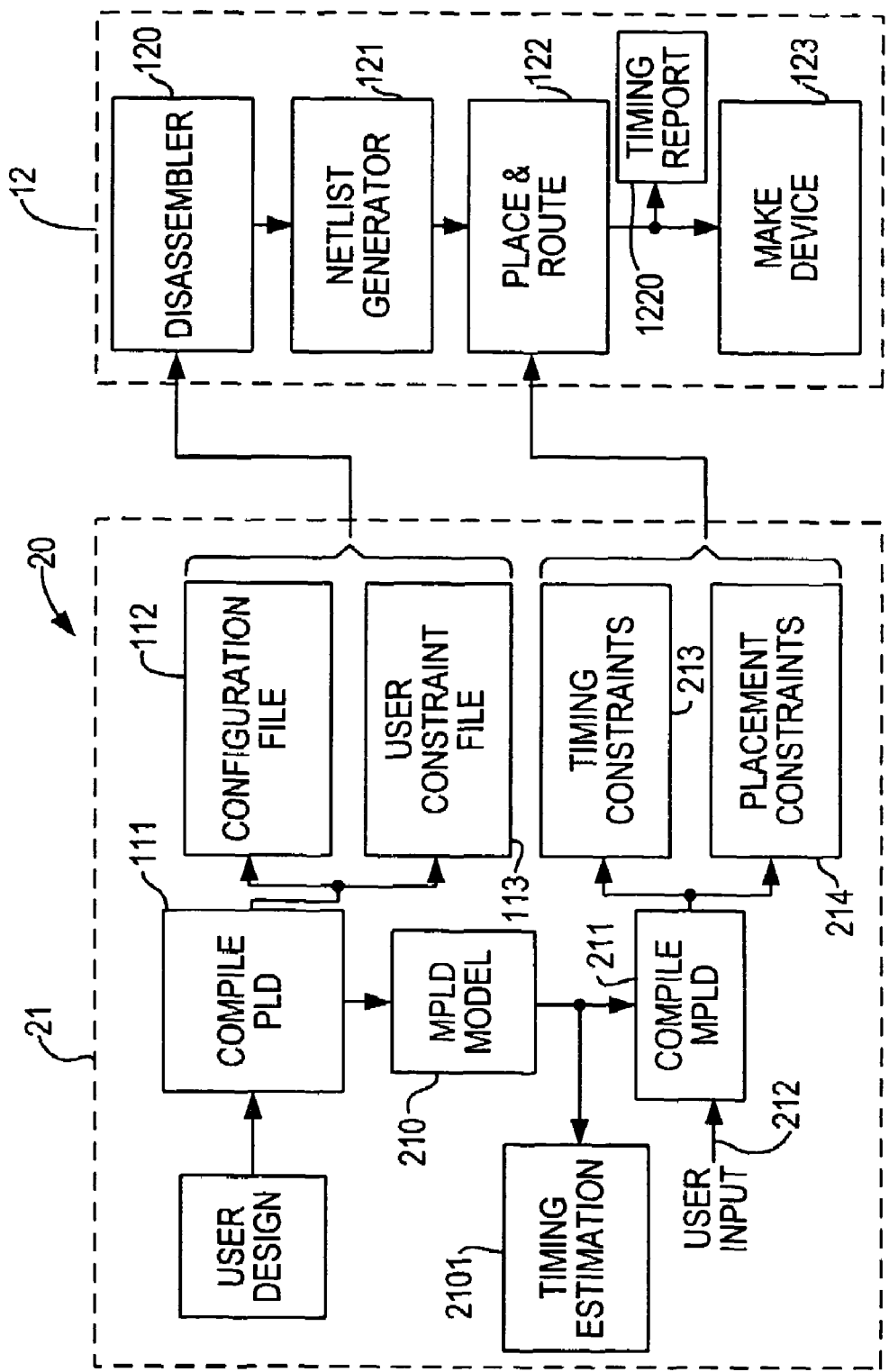
FIG. 1 is a flow diagram showing a first preferred embodiment of a programming method, in accordance with the present invention, for a mask-programmable logic device.
Figure 2:
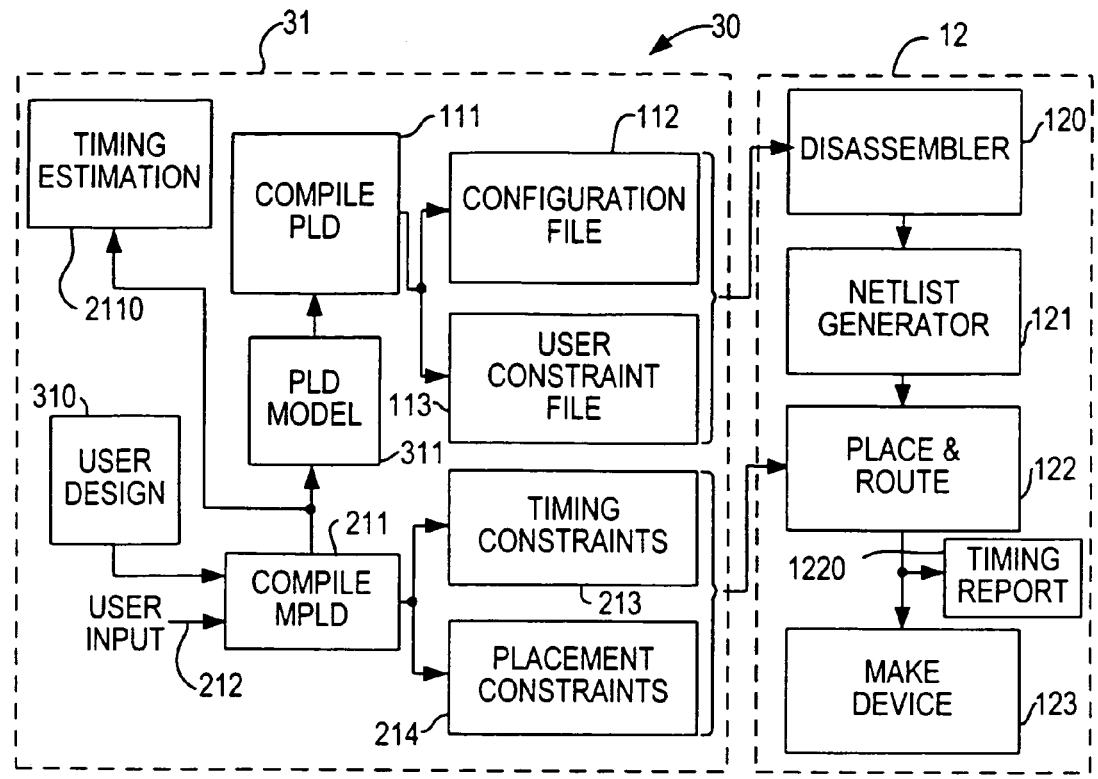
FIG. 2 is a flow diagram showing a second preferred embodiment of a programming method, in accordance with the present invention, for a mask-programmable logic device.
Figure 3:
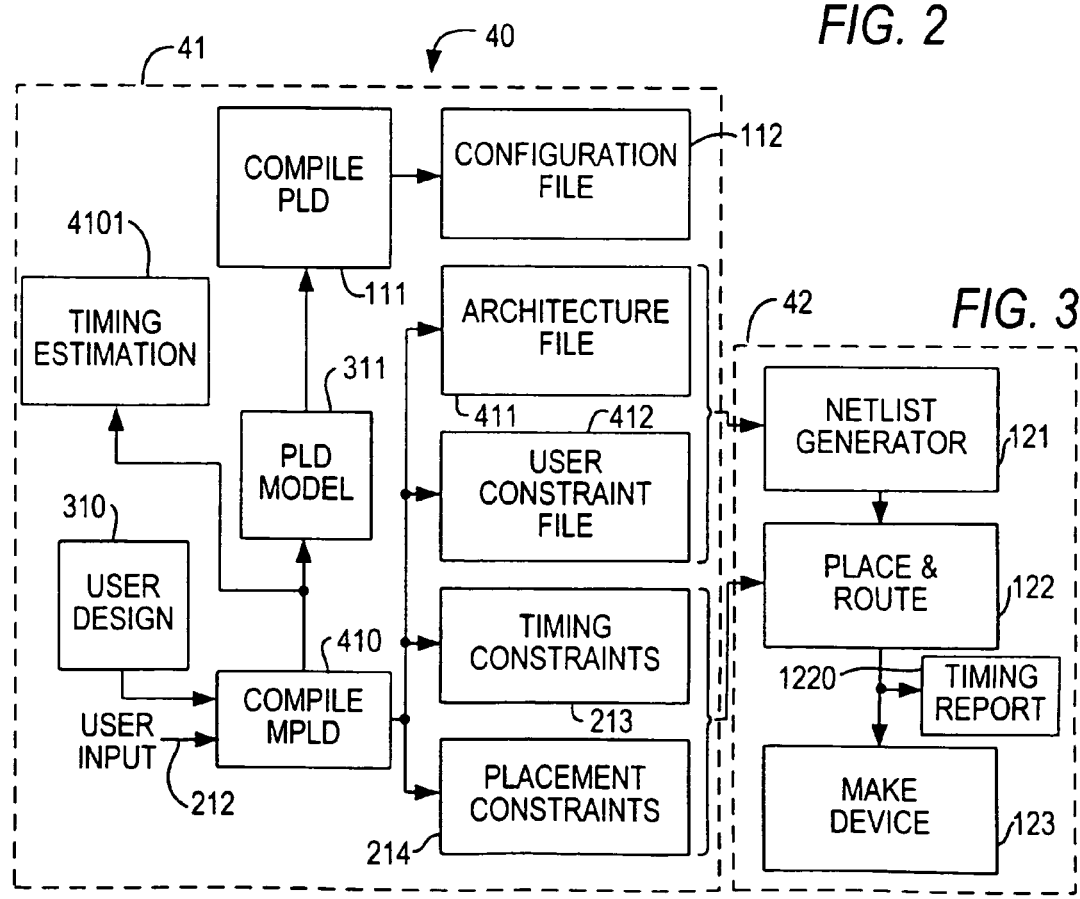
FIG. 3 is a flow diagram showing a third preferred embodiment of a programming method, in accordance with the present invention, for a mask-programmable logic device.

Three methods of programming a mask-programmable logic device ("MPLD") are shown in FIGS. 1–3.

In user portion 21 of a method 20 shown in FIG. 1, a user at step 110 enters a design for a user-programmable logic device ("UPLD") that is compatible or comparable with the MPLD to be programmed. After the UPLD design is compiled in step 111, the results are output not only to configuration file 112 and constraint file 113, but also to an MPLD model 210 in which the characteristics and responses of the corresponding MPLD—including the actual layout or "floorplan" of the MPLD—are represented, in effect translating UPLD functions to MPLD functions, which preferably are compiled at step 211. Preferably, the same compiling tool, preferably using the same algorithm and/or code base, is used in UPLD compiling step 111 and MPLD compiling step 211 (and MPLD compiling step 410—see FIG. 3). It should be noted that by using the same compiler on the same user design, there is a high degree of confidence, without complex verification, that a design that works in a UPLD will work in an MPLD.

The result of step 211 is a file 213 of timing constraints for the programmed MPLD, and a file 214 of placement constraints for the programmed MPLD. The user may provide input 212 to step 211 to guide the compilation at step 211. For example, if one of the user's goals is to have a certain clock run 50% faster in the MPLD version than in the UPLD version, that can be entered by the user at step 211, which then will "know" to favor speed over, e.g., reduced power consumption.

Files 112, 113 (which may be a single file) are provided to disassembler step 120 in supplier portion 12 of method 20. At step 120, configuration file 112 preferably is disassembled. Using knowledge of which model of UPLD the design was developed on, and the effect of each configuration bit on that UPLD, disassembler 120 can determine the logical functions that the design is to perform. That information allows netlist generation step 121 to create a netlist of the functions to be provided on the programmed MPLD. The netlist preferably is processed at place-and-route step 122, preferably using conventional place-and-route tools, which are well known, such as the APOLLO-II™ place-and-route tool available from Synopsys, Inc., of Mountain View, Calif. (formerly available from Avanti Corp., of San Jose, Calif.). Files 213 and 214, which also may be a single file, and which contain timing and placement data for the MPLD, preferably also are provided to place and route step 122. The results of place-and-route step 122 are used at step 123 to create the necessary metallizations to program the MPLD. A timing report 1220 may be produced after place-and-route step 122 that the user can use to verify that the desired timing relationships have been achieved.

In user portion 31 of method 30 (FIG. 2), the user defines the desired MPLD in terms of the MPLD itself in user design 310. This optimizes the design for the MPLD, because the design is created with the structure of the MPLD directly in mind in terms of the numbers and positioning of the various resources.

Design 310, and user inputs 212 of MPLD constraints such as, again, desired operating frequency, are input to MPLD compiler step 211, which again outputs timing and placement constraints 213, 214. The output of step 211 is also input at step 311 to a model in which the characteristics and responses of the corresponding UPLD are represented, in effect translating MPLD functions to UPLD functions, which preferably are compiled at step 111. Step 111 again generates UPLD configuration and constraint data 112, 113. Data 112, 113, 213, 214 are used in supplier portion 12 of method 30 just as they are in supplier portion 12 of method 20.

Once again, a timing report 1220 may be produced after place-and-route step 122 that the user can use to verify that the desired timing relationships have been achieved. And again, the user while performing user portion 31 of method 30 will not have the benefit of timing report 1220. Therefore, in accordance with the present invention, a timing estimation is provided at step 2110.

In user portion 41 of method 40 (FIG. 3), the user defines the desired MPLD in terms of the MPLD itself in user design 310. That design 310, and user inputs 212 of MPLD constraints such as, again, desired operating frequency, are input to MPLD compiler step 410, which again outputs timing and placement constraints 213, 214, as well as architecture file 411 and user constraint file 412. In this case, the MPLD design does not have to be converted to a UPLD design simply to provide configuration and constraint files 112, 113 for use by a disassembler 120. Instead architecture and constraint files 411, 412 provided by compiler step 411 are used directly by netlist generator 121 of supplier portion 42 of method 40, which needs no disassembler 120. However, the output of compiler step 410 may optionally be input at step 311 to a model in which the characteristics and responses of the corresponding UPLD are represented, in effect translating MPLD functions to UPLD functions, which may then be compiled at step 111. Step 111 in this case generates UPLD configuration data 112, which can be used, if desired, to program a UPLD to simulate the desired MPLD before committing to having the supplier make the programmed MPLD at step 123.

Once again, a timing report 1220 may be produced after place-and-route step 122 that the user can use to verify that the desired timing relationships have been achieved. And again, the user while performing user portion 41 of method 40 will not have the benefit of timing report 1220. Therefore, in accordance with the present invention, a timing estimation is provided at step 4101.

FIGS. 4–10 illustrate one example of the computation of a timing estimation in accordance with the present invention.

Figure 4:
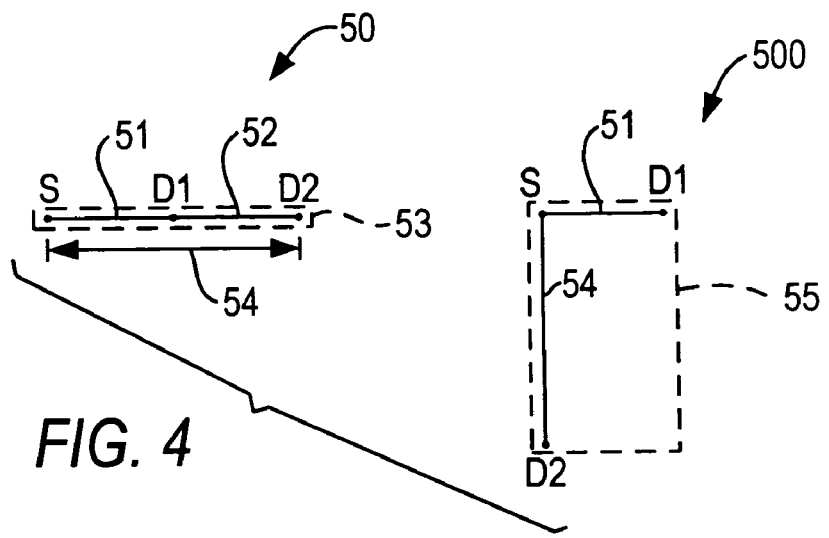
FIG. 4 is a diagram showing the effect of Manhattan distance and bounding box dimension on delay for low fanout.

FIG. 4 illustrates the contributions of Manhattan distance and bounding box dimension where fanout=2—i.e., where a single source sends signals to two destinations. In arrangement 50, source S and destinations D1 and D2 are arranged in a straight line. The Manhattan distance from S to D1 is the length of line segment 51, while the Manhattan distance 54 from S to D2 is the sum of the lengths of line segments 51 and 52. Bounding box 53 has negligible area, but its maximum linear dimension is the same as the Manhattan distance 54 from S to D2. In arrangement 500 the same source S and destinations D1 and D2 are arranged in an L-shaped configuration. The Manhattan distances from S to D1 and from S to D2 are the same as in arrangement 50, but the dimensions of bounding box 55 are much different from those of bounding box 53. Although the delay contribution from Manhattan distance is the same in both arrangements, the larger area of bounding box 55 results in larger capacitive delays, so that total delay is increased.

Figure 5:
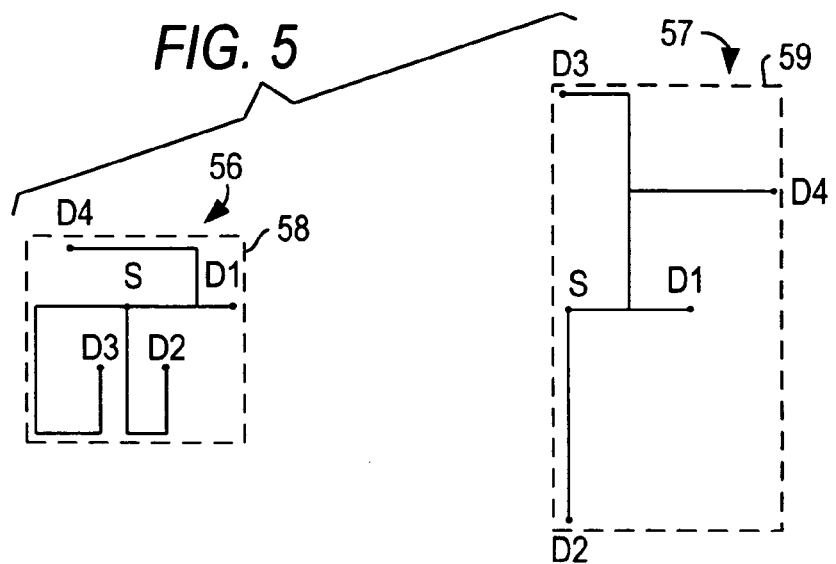
FIG. 5 is a diagram showing the effect of Manhattan distance and bounding box dimension on delay for higher fanout.

FIG. 5 shows how differences in routing affect Manhattan distance and bounding box dimension in a case where fanout=4. Here, the distances from S to each of D1, D2, D3 and D4 is the same in both arrangements 56, 57, but bounding box 59 is much larger than bounding box 58. The result of the higher fanout (as compared to FIG. 4) is that for a given Manhattan distance or bounding box size, there generally will be more wire, and therefore more delay as a result of capacitance and related factors. Moreover, each destination contributes to capacitance, so the greater number of destinations also contributes to delay.

Figure 6:
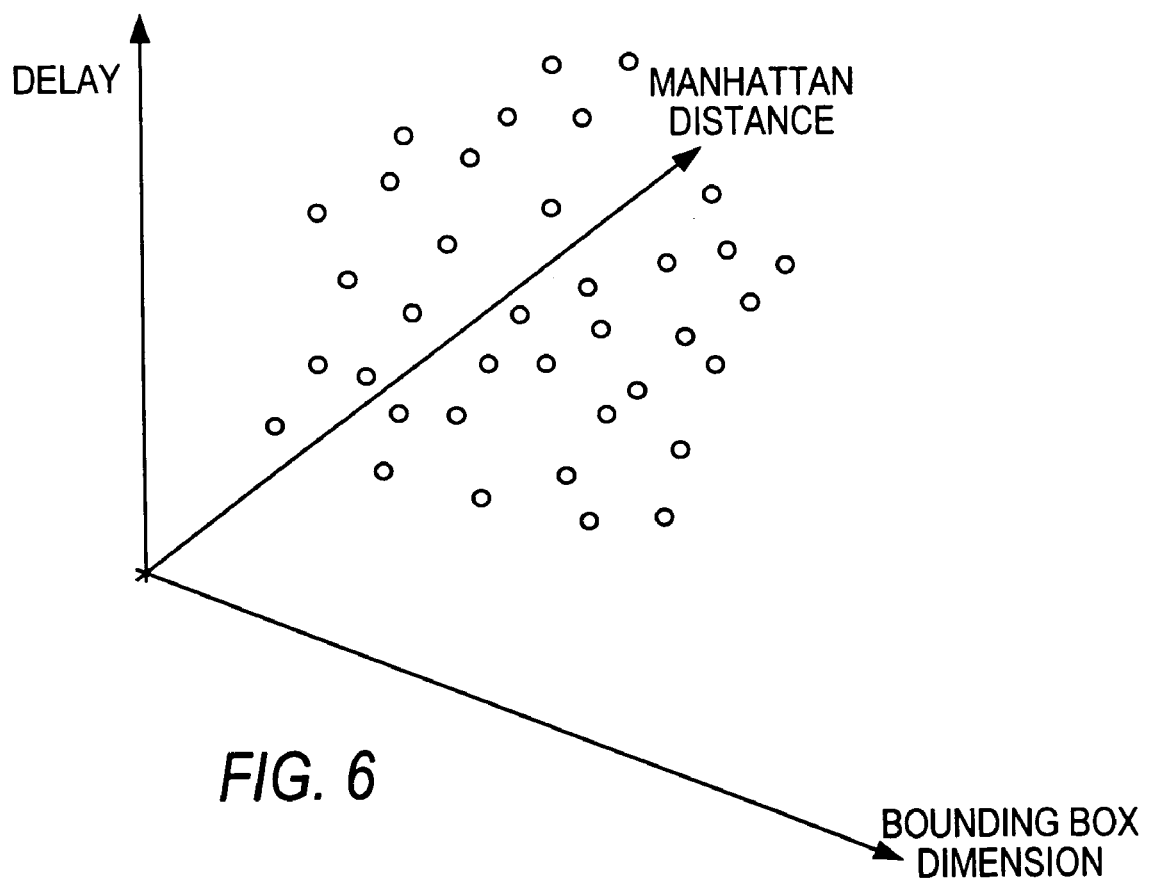
FIG. 6 is a three-dimensional plot simulating measured actual delay in previously programmed devices.
Figure 7:
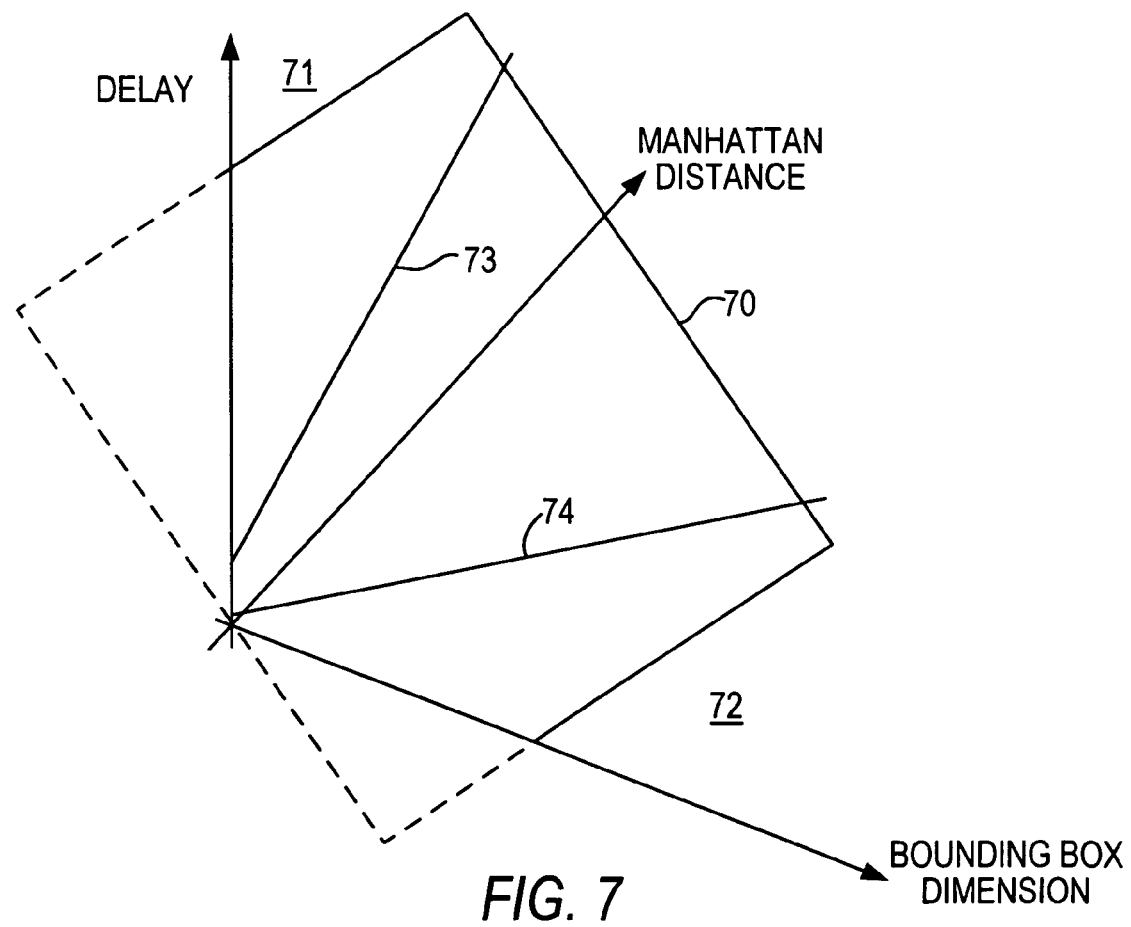
FIG. 7 is a representation of a planar function fit to the delays shown in FIG. 6.

FIG. 6 is a representation of measured actual delays for devices similar to those being modeled, as distributed in a three-dimensional space representing delay as a function of both Manhattan distance and bounding box dimension. As shown in FIG. 7 in schematic manner only, a plane 70 can be fit to the distribution in FIG. 6, although it should be noted that the best fit to the distribution in FIG. 6 may be a surface other than a plane. Plane 70 intersects the plane 71 defined by the delay axis and the Manhattan distance, and the plane 72 defined by the delay axis and the bounding box dimension axis, in respective linear functions 73, 74. If the best fit surface is other than a plane, functions 73, 74 would not be linear.

Figure 8:
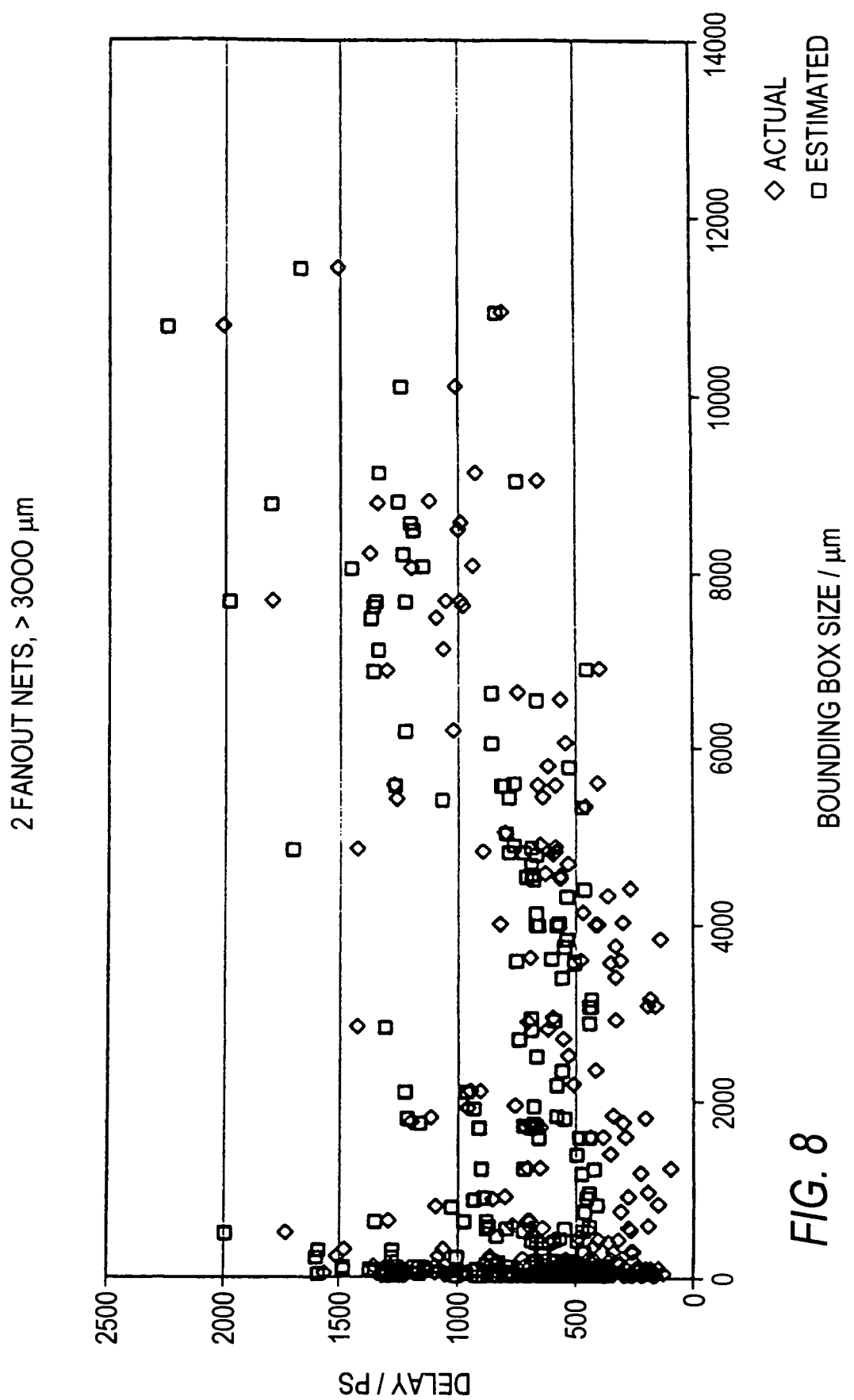
FIG. 8 is a two-dimensional plot showing the projection of the points plotted in FIG. 6 as a function of bounding box dimension, for larger dimensions.

Functions 73, 74 may be used to estimate the effect on delay of a change in Manhattan distance or a change in bounding box dimension, respectively. However, the actual effect of each component on delay is better represented by the plots in FIGS. 8–11. In FIG. 8, each diamond is the projection of an actual measured delay point onto plane 72 for a two-fanout net where Manhattan distances and bounding box dimensions exceed 3000 µm. Each diamond also has a corresponding square, which is the result of projecting the corresponding actual delay point onto the best-fit surface, and from there onto plane 72, to represent estimated delay as a function of bounding box dimension. Similarly, in FIG. 9, each diamond is the projection of an actual measured delay point onto plane 71. Each diamond also has a corresponding square, which is the result of projecting the corresponding actual delay point onto the best-fit surface, and from there onto plane 71 to represent estimated delay as a function of Manhattan distance.

Figure 9:
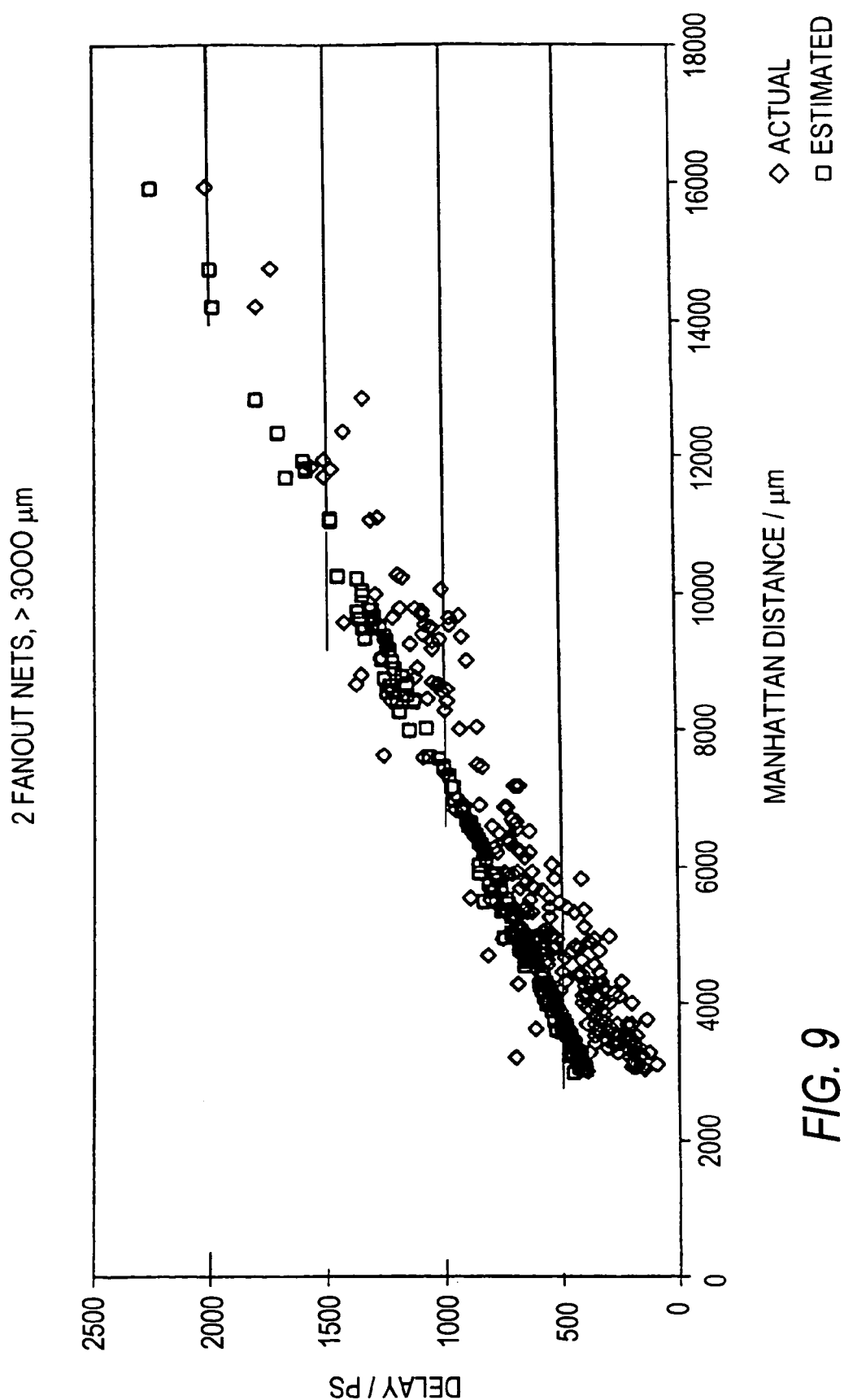
FIG. 9 is a two-dimensional plot showing the projection of the points plotted in FIG. 6 as a function of Manhattan distance, for larger dimensions.
Figure 10:
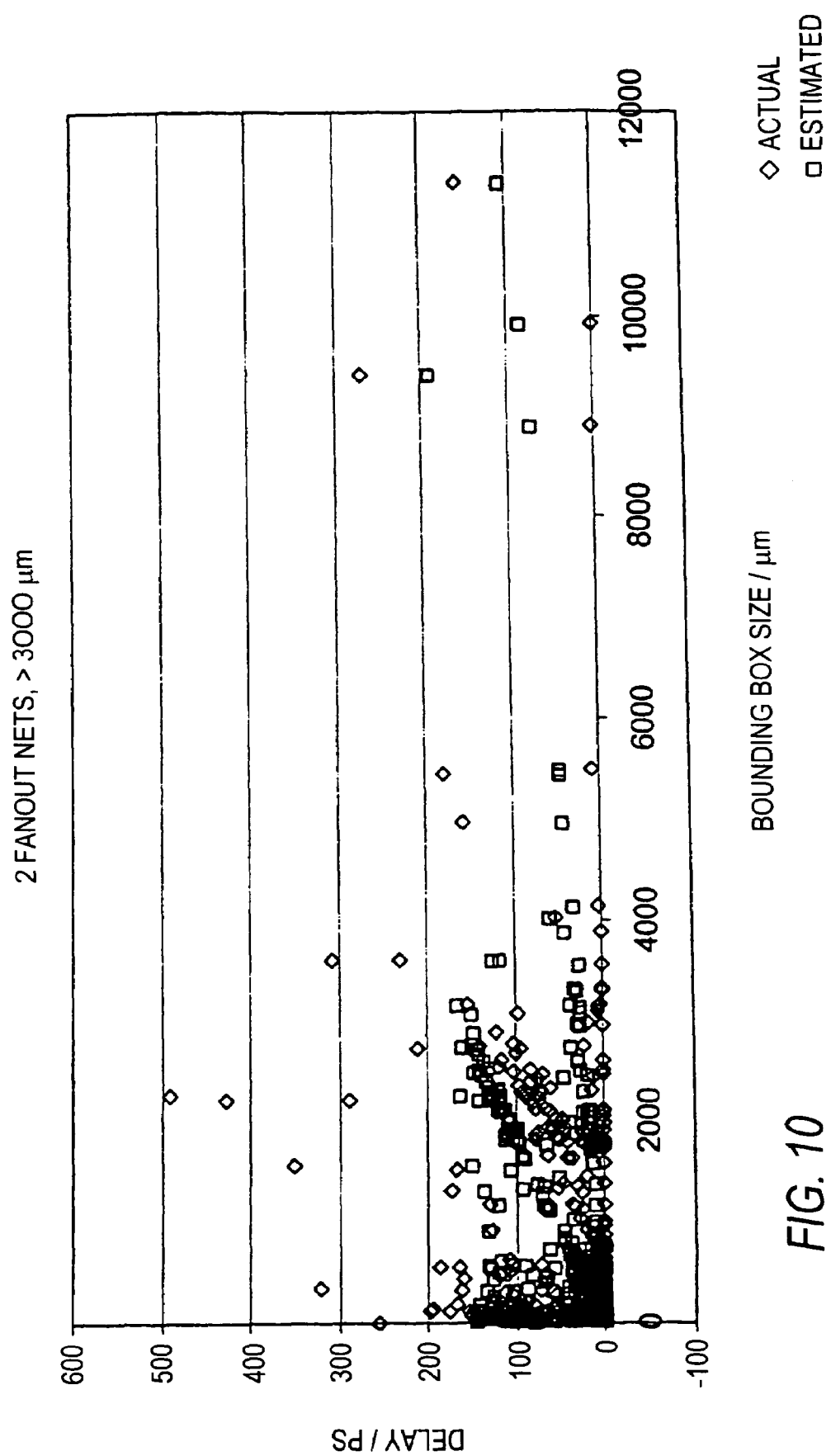
FIG. 10 is a two-dimensional plot showing the projection of the points plotted in FIG. 6 as a function of bounding box dimension, for smaller dimensions.
Figure 11:
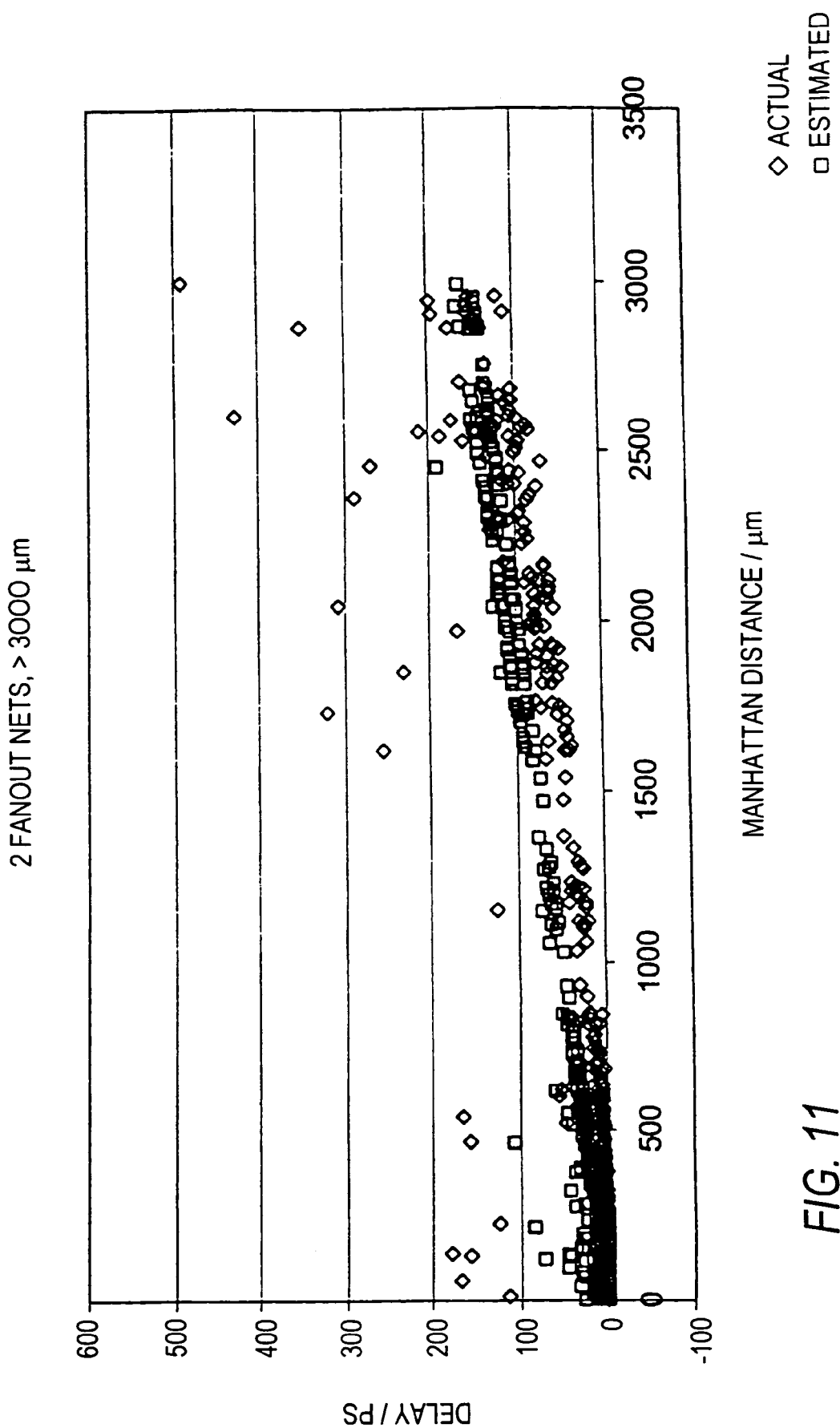
FIG. 11 is a two-dimensional plot showing the projection of the points plotted in FIG. 6 as a function of Manhattan distance, for smaller dimensions.

If functions 73, 74 were identical, then the best-fit surface would be orthogonal to each of planes 71, 72, and all of the squares in FIGS. 8 and 9 would lie along curves (e.g., straight lines) represented by functions 73, 74. Instead, as can be seen, the "tilt" of the best-fit surface causes the projections of different points on the best-fit surface to deviate from functions 73, 74. FIGS. 10 and 11 are similar to FIGS. 8 and 9, except that distances are smaller than 3000 µm.

As can be seen in both cases, the effect of Manhattan distance is more or less linear. The effect of bounding box dimension appears to be more significant for greater dimensions and relatively insignificant for smaller dimensions. Although not shown, it has been observed that for larger fanout nets, the effect of bounding box dimension becomes more linear.

Figure 12:
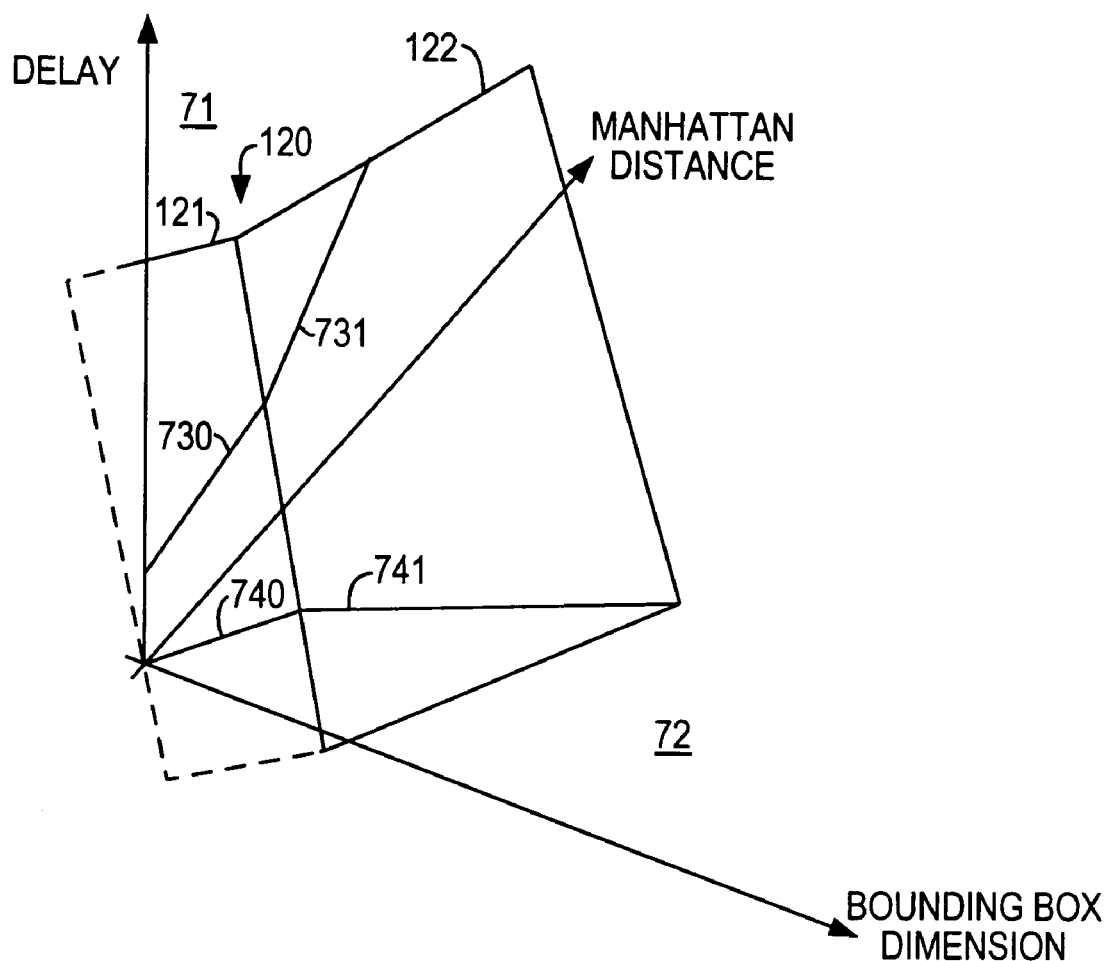
FIG. 12 is a representation, similar to FIG. 7, where the resulting function is a planar function having two different planar portions.

Because the contribution to delay by the different factors differs in different ranges of dimensions, as illustrated by the differences between FIGS. 8 and 9 on the one hand, and FIGS. 10 and 11 on the other hand, a better model may result if different surfaces are fit to the actual measured delay points in different ranges. Thus, FIG. 12 shows a best-fit surface 120 having two planar components 121 (at smaller dimensions) and 122 (at greater dimensions), intersecting plane 71 in functions 730, 731, and intersecting plane 72 in functions 740, 741.

The models illustrated in FIGS. 6–11 do not include the pessimistic offset discussed above. However, that offset can simply be added to the functions described to create the desired degree of pessimism.

Other models may be created. However, whatever model is created is made available, in accordance with the invention, to the user at steps 2101, 2110 and 4101, to provide an estimate of timing delays for the user's logic design. Preferably, an MPLD manufacturer will create a specific timing model for each specific model of MPLD sold by that manufacturer, preferably by creating a statistically significant number of "user" designs on its own for each MPLD. However, as discussed above, it is sufficient to create a model for each MPLD based on similar technology—e.g., a 130 nm model, a 90 nm model, etc.

Figure 13:
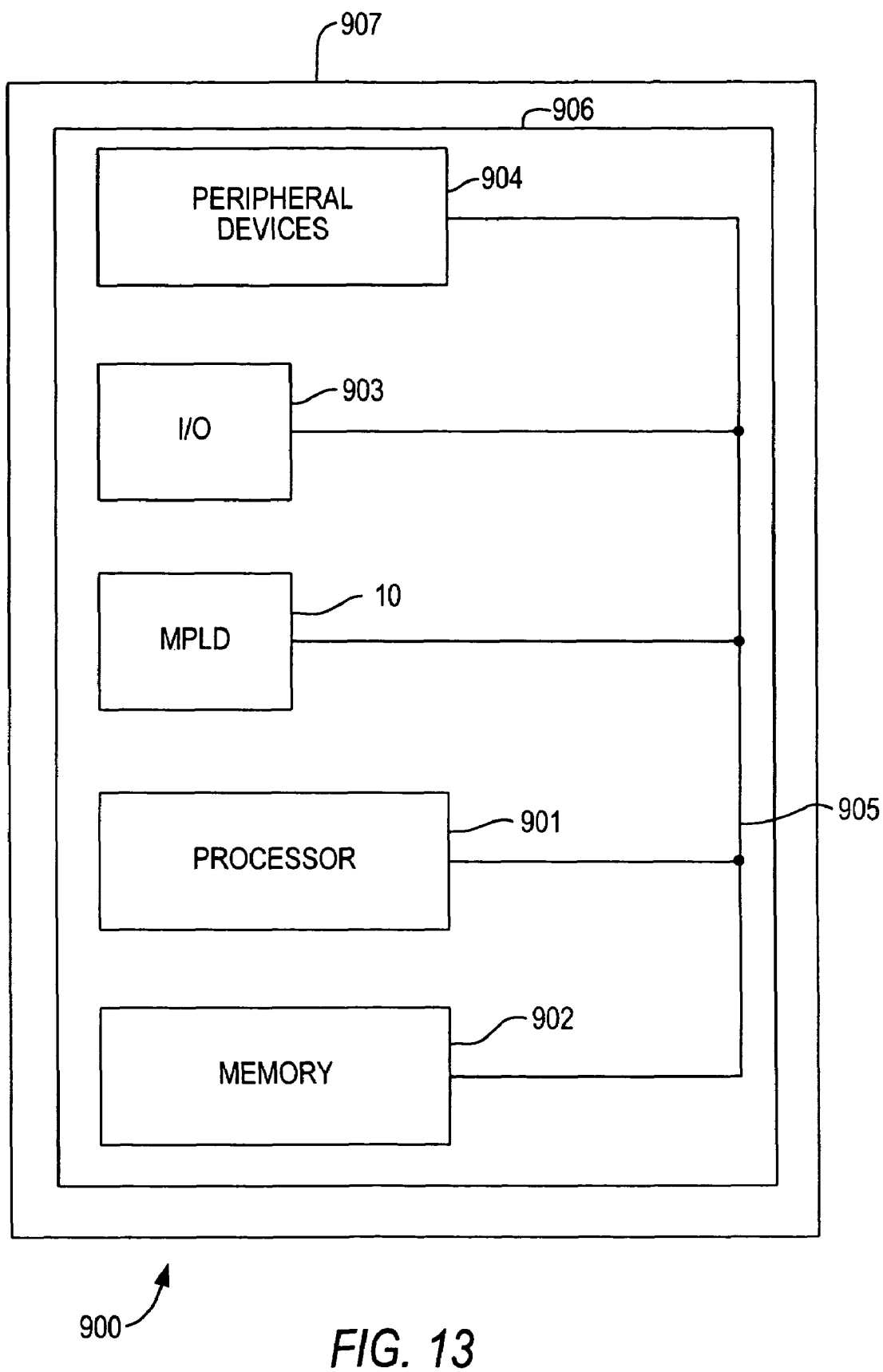
FIG. 13 is a simplified block diagram of an illustrative system employing a mask-programmable logic device programmed in accordance with the present invention.

MPLD 10 programmed in accordance with the present invention may be used as part of a data processing system 900 shown in FIG. 13. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. MPLD 10 can be used to perform a variety of different logic functions. For example, MPLD 10 can be configured as a processor or controller that works in cooperation with processor 901. MPLD 10 may also be used as an arbiter for arbitrating access to a shared resources in system 900. In yet another example, MPLD 10 can be configured as an interface between processor 901 and one of the other components in system 900. It should be noted that system 900 is only exemplary, and that the true scope and spirit of the invention should be indicated by the following claims.

Various technologies can be used to implement MPLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of programming a mask-programmable logic device to create a mask-programmed logic device that performs one or more desired functions, said method comprising:
   designing programming to perform said one or more desired functions, thereby creating one or more programmable logic device programming files for said mask-programmable logic device; wherein said designing comprises:
   estimating routing delays for said mask-programmed logic device prior to said creating of said one or more programmable logic device programming files for said mask-programmable logic device;
   presenting said estimated routing delays to a user; and
   accepting input from said user based on said estimated routing delays.

2. The method of claim 1 wherein said estimating comprises determining routing delays from a statistical model of routing delays applicable to said mask-programmable logic device.

3. The method of claim 2 wherein said determining comprises:
   determining routing delays from a statistical model constructed based on actual delays in prior implementations of programming on a device applicable to said mask-programmable logic device.

4. The method of claim 3 wherein said statistical model is based on at least one of:
   (a) Manhattan distance for connections in a given net;
   (b) bounding box dimension for a given net; and
   (c) fanout number of a given net.

5. The method of claim 4 wherein, for each fanout number, said statistical model comprises a function fit to at least distributions of one or more of said Manhattan distances.

6. The method of claim 5 wherein said function is fit by a least-squares fit.

7. The method of claim 6 wherein said least-squares fit is adjusted to be pessimistic.

8. The method of claim 7 wherein said adjustment is such that modeled delay is longer than said actual delays in 90% of cases.

9. The method of claim 5 wherein said function is a pessimistic fit.

10. The method of claim 9 wherein said adjustment is such that modeled delay is longer than said actual delays in 90% of cases.

11. The method of claim 5 wherein:
said statistical model comprises a plurality of functions; and
each function of said plurality of functions is fit to a separate range of distributions of one or more of said Manhattan distances.

12. The method of claim 4 wherein, for each fanout number, said statistical model comprises a function fit to at least distributions of one or more of said bounding box dimensions.

13. The method of claim 12 wherein said function is fit by a least-squares fit.

14. The method of claim 13 wherein said least-squares fit is adjusted to be pessimistic.

15. The method of claim 14 wherein said adjustment is such that modeled delay is longer than said actual delays in 90% of cases.

16. The method of claim 12 wherein said function is a pessimistic fit.

17. The method of claim 16 wherein said adjustment is such that modeled delay is longer than said actual delays in 90% of cases.

18. The method of claim 12 wherein:
said statistical model comprises a plurality of functions; and
each function of said plurality of functions is fit to a separate range of distributions of one or more of said bounding box dimensions.

19. The method of claim 4 wherein, for each fanout number, said statistical model comprises a function fit to both (a) distributions of one or more of said Manhattan distances, and (b) distributions of one or more of said bounding box dimensions.

20. The method of claim 19 wherein said function is fit by a least-squares fit.

21. The method of claim 20 wherein said least-squares fit is adjusted to be pessimistic.

22. The method of claim 21 wherein said adjustment is such that modeled delay is longer than said actual delays in 90% of cases.

23. The method of claim 19 wherein said function is a pessimistic fit.

24. The method of claim 23 wherein said adjustment is such that modeled delay is longer than said actual delays in 90% of cases.

25. The method of claim 19 wherein:
said statistical model comprises a plurality of functions; and
each function of said plurality of functions is fit to a separate range of distributions of one or more of said Manhattan distances and one or more of said bounding box dimensions.

26. The method of claim 4 wherein said model is pessimistic.

27. The method of claim 26 wherein modeled delay is longer than said actual delays in 90% of cases.

28. A mask-programmed logic device, programmed in accordance with the method of claim 1.

29. A digital processing system comprising:
processing circuitry;
a memory coupled to said processing circuitry; and
a mask-programmed logic device, programmed in accordance with the method of claim 1, coupled to the processing circuitry and the memory.

30. A printed circuit board on which is mounted a mask-programmed logic device programmed in accordance with the method of claim 1.

31. The printed circuit board defined in claim 30 further comprising:
memory circuitry mounted on the printed circuit board and coupled to the mask-programmed logic device.

32. The printed circuit board defined in claim 31 further comprising:
processing circuitry mounted on the printed circuit board and coupled to the memory circuitry.

* * * * *